United States Patent
Nani et al.

(10) Patent No.: US 8,659,460 B2
(45) Date of Patent: Feb. 25, 2014

(54) SUCCESSIVE APPROXIMATION REGISTER ADC CIRCUITS AND METHODS

(75) Inventors: Claudio Nani, Capriano del Colle (IT); Erwin Janssen, Veldhoven (NL); Konstantinos Doris, Amsterdam (NL); Athon Zanikopoulos, Eindhoven (NL)

(73) Assignee: NXP, B.V., Eindhoven (NL)

(*) Notice: Subject to any disclaimer, the term of this patent is extended or adjusted under 35 U.S.C. 154(b) by 22 days.

(21) Appl. No.: 13/558,525

(22) Filed: Jul. 26, 2012

(65) Prior Publication Data
US 2013/0033392 A1 Feb. 7, 2013

(30) Foreign Application Priority Data
Aug. 3, 2011 (EP) .................................. 11176441

(51) Int. Cl.
*H03M 1/12* (2006.01)

(52) U.S. Cl.
USPC ........... 341/155; 341/118; 341/120; 341/163; 341/172

(58) Field of Classification Search
USPC .......................... 341/118, 120, 155, 163, 172
See application file for complete search history.

(56) References Cited

U.S. PATENT DOCUMENTS

| | | | |
|---|---|---|---|
| 5,099,239 A * | 3/1992 | Bruce et al. | 341/155 |
| 5,235,333 A * | 8/1993 | Naylor et al. | 341/118 |
| 6,313,779 B1 * | 11/2001 | Leung et al. | 341/155 |
| 6,351,231 B1 * | 2/2002 | Price et al. | 341/155 |
| 7,495,589 B1 * | 2/2009 | Trifonov et al. | 341/118 |
| 7,764,215 B2 * | 7/2010 | Wan et al. | 341/163 |
| 2009/0128386 A1 * | 5/2009 | Meynants et al. | 341/144 |
| 2010/0164770 A1 * | 7/2010 | Wan et al. | 341/133 |
| 2011/0133971 A1 | 6/2011 | Ogawa et al. | |
| 2012/0112937 A1 * | 5/2012 | Yamase et al. | 341/110 |

FOREIGN PATENT DOCUMENTS

| | | |
|---|---|---|
| JP | 2010-124405 A | 6/2010 |
| WO | 2010/044000 A1 | 4/2010 |

OTHER PUBLICATIONS

Extended European Search Report for European Patent Appln. 11176441.1 (Jan. 13, 2012).
Janssen, E. et al. "A Direct Sampling Multi-Channel Receiver for DOCSIS 3.0 in 65nm CMOS", Symposium on VLSI Circuits, 2 pgs. (Jun. 2011).

* cited by examiner

*Primary Examiner* — Linh Nguyen (57) ABSTRACT

A non-binary successive approximation analogue to digital converter, for converting using successive conversion steps, is operable in first and second modes. The first and second modes have different noise properties and the converter is switched between the modes during the conversion process.

13 Claims, 6 Drawing Sheets

SUCCESSIVE APPROXIMATION REGISTER ADC CIRCUITS AND METHODS

This application claims the priority under 35 U.S.C. §119 of European patent application no. 11176441.1, filed on Aug. 3, 2011, the contents of which are incorporated by reference herein.

FIELD OF THE INVENTION

This invention relates to successive approximation register ADC circuits and methods.

BACKGROUND OF THE INVENTION

A clear trend in modern telecommunication receiver architectures is the implementation of an increasing number of receiver functionalities in the digital domain. This poses serious challenges in the Analog to Digital (ND) converter (ADC) design because of the increasing resolution and sampling frequency needed to correctly convert the broadband signals at the output of the RF blocks (LNAs or mixers). Moreover, these high performance ND converters are often integrated together with the digital baseband hardware and therefore have to be implemented in scaled CMOS technologies. The reduced voltage supply and the degradation of the intrinsic gain of the devices of modern technologies call for ND architectures that do not rely on high precision analog blocks for their operations.

Among these, the Successive Approximation Register (SAR) scheme stands as a promising candidate because it allows high power efficiency to be achieved while minimizing the amount of required analog hardware. In combination with the time Interleaving technique, SAR ND converters can be used to realize high speed and high resolution A/D converters with excellent power efficiency.

US2011133971 (A1) describes a SAR ADC including a digital-to-analog converter, a first comparator that compares an input analog signal with a reference analog signal, a second comparator that compares an input analog signal with a reference analog signal, a selection circuit that selects one of comparison results of the first comparator and the second comparator, and a control circuit that changes the multibit digital signal sequentially based on the selected comparison result in a plurality of steps so that the reference analog signal becomes closer to the input analog signal, and the control circuit controls the selection circuit to select the comparison result of the first comparator up to an intermediate step on the way of the plurality of steps and to select the comparison result of the second comparator after the intermediate step, and changes the bit value of the multibit digital signal according to the non-binary algorithm.

SUMMARY OF THE INVENTION

Figure 1:
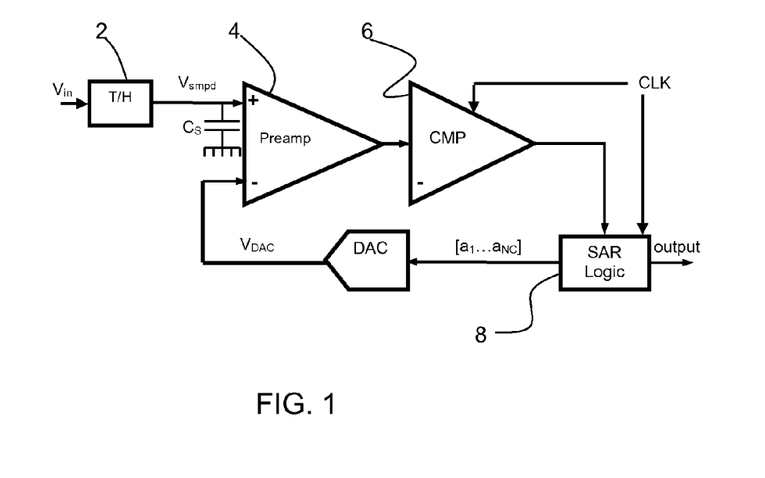
FIG. 1 shows a known SAR analogue to digital converter.

FIG. 1 is a block diagram of one example of an SAR converter.

The circuit comprises a track and hold (i.e. sample and hold) circuit 2 which receives the input Vin. The sampled input is held on a capacitor Cs, amplified by a preamplifier 4 and provided to a comparator 6. The comparator compares the amplified input with an analogue value $V_{DAC}$ which is the analogue version of a digital signal generated by the SAR logic block 8 as part of the conversion process.

During the first clock cycle of the conversion process the input analog signal is sampled by the T/H block on a capacitor $C_S$ and held constant for the entire duration of the conversion process.

The circuit can be implemented using single ended signals or differential signals.

For a differential implementation, immediately after sampling, the SAR controller 8 sets the DAC output $V_{DAC}$ to 0 and the sign of the difference Vsmpd−$V_{DAC}$ is evaluated during the second clock cycle by means of the comparator (preceded by the preamplifier). In this case, both Vin and $V_{DAC}$ represent signed values. If the comparison result is positive ($a_1$=1), the first DAC weight w1 is added to the DAC output otherwise it is subtracted.

Because Vin and Vdac are signed values, the comparison with 0 can be made in the first cycle, since half of the range is above and half is below the 0 value. In this way, $V_{smpd}$ and $V_{DAC}$ represent differential signals.

Note that in the alternative single ended architecture, Vreference/2 would be the first value to compare with $V_{smpd}$.

Returning to the differential implementation, during the second conversion step (3rd clock cycle) the sign of the difference $V_{smpd}$−$V_{DAC}$ is evaluated again and the second DAC weight w2 is added (if $a_2$=1) or subtracted (if $a_2$=−1) from the DAC output. This sequence of operations is repeated $N_C$ times until all the DAC weights ($w_i$) are added/subtracted to the output $V_{DAC}$.

At the end of the conversion process, the DAC output is equal to an approximation of the sampled signal that can be written as follows:

$$\hat{V}_{smpd} = \sum_{i=1}^{N_C} a_i w_i$$

with $$a_i = \{1; -1\}$$

where the term $a_i$ indicates the comparator decision at the conversion step i ($a_i$=1 if positive otherwise −1). The sequence of $a_i$ is then used by the SAR controller to reconstruct the binary representation of the sampled signal. If the number of comparisons $N_C$ and the set of weights w1 is properly chosen, the final maximum approximation error will be equal to the value of the DAC weight used in the last step $w_{NC}$ (in ADC terms LSB/2).

The most common criteria for sizing the weights $w_i$ is to scale them according to a binary law (binary search algorithm). In this specific case, the sequence of $a_i$ represents directly the binary code approximating of the sampled signal. This choice minimizes the number of steps required for a given level of accuracy but on the other hand does not leave any room for comparison errors.

In fact, if at the jth step the sign of the approximation error is not determined correctly, the weight $w_j$ is wrongly added/subtracted such that the resulting approximation error (Vsmpd−$V_{DAC}$) is increased instead of being decreased (or vice versa) by $w_j$. During the following conversion steps, the binary successive approximation algorithm will try to compensate by adding properly all the remaining weights but the final approximation error Vsmpd−V^smpd will still be bigger than the target $w_{NC}$.

Figure 2:
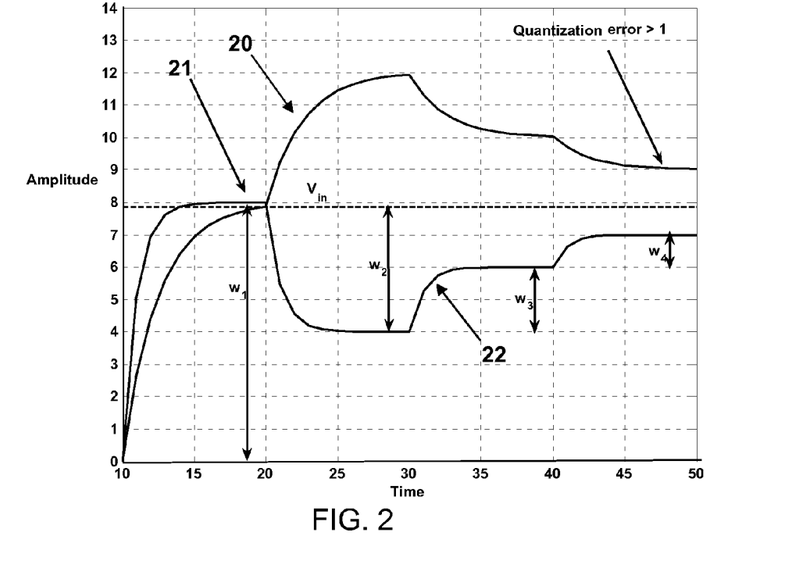
FIG. 2 shows the normal operation of the converter of FIG. 1 operating as a binary converter, and the effect of a comparison error.

An example of this behavior is depicted in FIG. 2, which shows an example of binary successive approximation algorithm. In plot 20, a comparison error is made at step 2 (associated with weight w2) at the timing shown as 21 resulting in a wrong approximation of the input signal (Vin). The value $V_{DAC}$ had not reached the sampled analogue value in time. Plot 22 is the correct signal output. The dotted line is the analogue signal held on the capacitor Cs to which comparison is made by the comparator. This applies to FIGS. 3 to 5 also.

This comparison error produced at step 2 can be due to the limited bandwidth of the DAC and preamplifier. As a consequence of that, the weight w2 is added to the DAC output instead of being subtracted. During the next conversion steps all the other DAC weights are subtracted from $V_{DAC}$ but the final approximation error is still bigger than its theoretical maximum (in the depicted case equal to $w_4=1$).

In the example above, the cause of the comparison error can be the finite bandwidth of the DAC and preamplifier. In order to prevent these errors it is therefore necessary that the output of the preamplifier and the DAC must be settled within 1 LSB before the comparator decision is taken. This shortcoming can be solved by modifying the successive approximation algorithm such that a comparison error can be compensated by the following conversion steps.

Redundancy can be introduced by increasing the number of comparisons $N_C$ and by choosing a set of weights such that for every step j, the sum of the weights used in the remaining steps, defined by:

$$\sum_{j+1}^{N_C} w_i$$

exceeds the value of the unit $w_j$ that has been incorrectly added.

The resulting conversion process is commonly referred to as a non-binary successive approximation algorithm. The redundancy condition can be expressed formally as follows:

$$o_j = \sum_{i=j+1}^{N_C} w_i - w_j > 0$$

The difference oj between the value $w_j$ and $$\sum_{j+1}^{N_C}$$

$w_j$ is often called the overrange and it represents the maximum error at the jth step that can be corrected by the following comparisons.

As an example, the comparison error can be assumed to arise at the step j. This error is again shown as 21 in FIG. 3 (for the example of j=2), which is an example of non-binary successive approximation algorithm in which one redundant cycle is added compared to the binary search of FIG. 2. In this case, even if a comparison error occurs as in plot 30, the sampled signal Vin is still correctly approximated. The correct sequence without errors is shown as plot 32.

Figure 3:
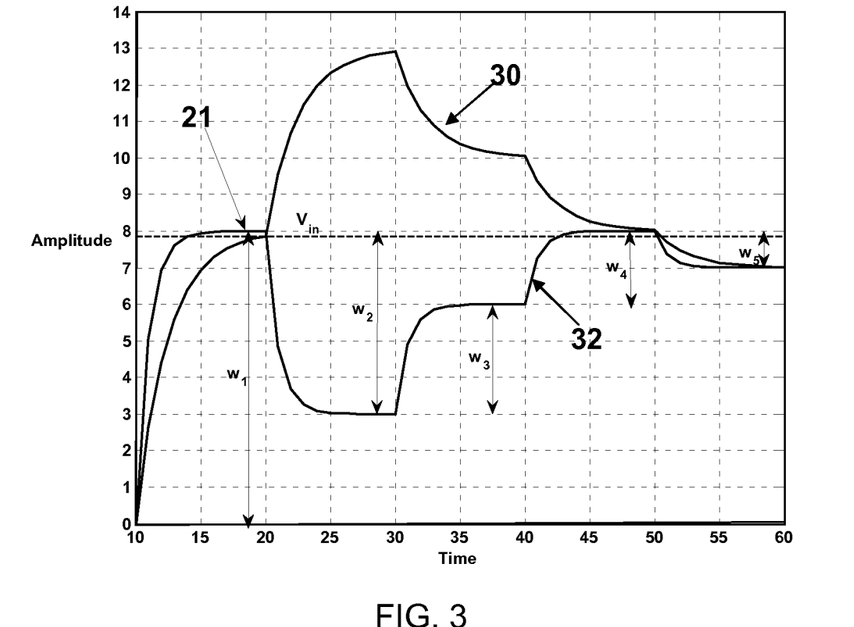
FIG. 3 shows the normal operation of the converter of FIG. 1 operating as a non-binary converter, and how a single comparison error can be compensated.

Due to the wrong comparison result, the magnitude of the approximation error Vsmpd–$V_{DAC}$ at the beginning of step j+1 increases (instead of decreasing) by the added weight $w_2$. As for the binary search, during the following conversion steps (j+1 to $N_C$) the successive approximation algorithm will try to minimize this error by properly combining the weights $w_j+1 \ldots w_{NC}$. In this case, if the approximation error at step j (when the error occurs) is smaller than the overrange oj, the algorithm will be able to find a proper combination of $w_{j+1} \ldots w_{NC}$ such that input signal can still be correctly approximated.

As a consequence, it is only required that the DAC and the preamplifier output settles within the overrange in order to prevent comparison errors. This property relaxes greatly the bandwidth requirements of the DAC and preamplifier and allows the conversion speed to be increased. The choice of the DAC weights wi determines the amount of overrange available at every conversion step.

For most practical weights set, the available overrange oj is maximum during the first conversion steps (when the settling requirement is more stringent) and then decreases as the conversion proceeds.

The invention is directed to a further problem which arises in SAR converters, relating to thermal noise (otherwise known as Johnson-Nyquist noise, and kT/C noise). kT/C noise is normal thermal noise from resistors that are filtered by a capacitor: The total noise resulting from the combination of a noisy resistor R and a (noiseless) capacitor C is determined by 2kTR noise power of the resistor measured over a bandwidth BW, which is determined by the RC time constant. The product becomes independent of R hence the name kT/C noise.

Dealing with the thermal noise is a major challenge in designing high performance ND converters. In the SAR ND architecture there are two main sources of thermal noise:

Thermal noise from the sampling operation of the Track and Hold unit with power equal to kT/C.

Noise added during the conversion process by the DAC, preamplifier and the comparator.

Normal ways to make the design more tolerant to thermal noise include:

Increasing the sampling capacitor to reduce sampled thermal noise (4× increase to reduce noise power by half, e.g. to gain a bit). This has a major impact on operation speed and signal bandwidth of the converter.

Increasing the signal swing (2× signal increase to reduce the noise power by half). This is more efficient than increasing the capacitor size and reduces the impact of both sampled noise and noise added in the conversion process. The drawback is that at modern nm technologies it is extremely difficult to do so due to the lower supply levels offered. In addition, typically increasing the signal swing at the Track/Hold unit has major consequences for linearity and bandwidth due to the fact that the amplitude modulates the on-resistance of the sampling switch, which further dictates the bandwidth and linearity of the converter.

Increasing the gain of the preamplifier to reduce the relative impact of the comparator (noise in the conversion process).

Using more current in the comparator, pre-amplifier, and DAC to reduce their noise contribution.

Aspects of the invention are defined in the accompanying claims.

According to a first aspect, there is provided a non-binary successive approximation analogue to digital converter for converting using successive conversion steps, the converter comprising a sample and hold unit, a comparator, a logic unit, a digital to analogue converter, a preamplifier between the sample and hold unit and the comparator, and one or more capacitors which are switchable in or out of circuit at the output of the preamplifier for changing the noise properties, wherein the logic unit and the digital to analogue converter are in a feedback path around the comparator, and the converter is operable in first and second modes, the first and second modes having different noise properties and the converter is operable to switch between the modes during the conversion process.

The different noise properties essentially comprise different levels of total noise present, which may for example be due to the noise being integrated over different bandwidths.

The invention provides an arrangement which reduces the thermal noise inside a SAR converter, enabling a higher signal to noise ratio (SNR). By dynamically adapting the noise level of a non-binary SAR converter, a higher SNR can be realized. The approach has only a minimal impact on the power consumption and silicon area.

The converter can further comprise means for adjusting the duration of the conversion steps such that different durations are used in the first and second modes. The mode with lower noise can require a longer settling time, which is enabled by using a longer conversion step.

For this purpose, a clock circuit can be provided and the means for adjusting comprises a clock divider for reducing the frequency of the clock circuit output. A multiplexer can then be provided for selecting the clock circuit output or the frequency-reduced clock.

There are other ways to change the noise properties (which as explained above can be expressed as the total noise as integrated over the bandwidth for which that noise is present in the circuit), such as changing a bias current, providing a tunable electrical component (resistor, capacitor or transistor) or changing an electrical supply voltage.

In a further aspect there is provided a method of controlling a non-binary successive approximation converter, the converter comprising a sample and hold unit, a comparator, a logic unit, a digital to analogue converter, a preamplifier between the sample and hold unit and the comparator, and one or more capacitors which are switchable in or out of circuit at the output of the preamplifier for changing the noise properties, wherein the method comprises operating the converter in first and second modes during a conversion process using successive conversion steps by switching the one or more capacitors in or out of circuit, the modes having different noise properties.

In embodiments, a first batch of conversion steps are performed with the first mode of operation, with a first noise level, and a second later batch of conversion steps are performed with the second mode of operation, with a smaller, second noise level.

In this way, the noise is larger at the beginning of the conversion process, because any errors can be corrected later in the conversion (by the redundancy built in to the non-binary process). Errors arising in the later conversion steps may not be correctable, so a lower noise level is used.

BRIEF DESCRIPTION OF THE DRAWINGS

Examples of the invention will now be described in detail with reference to the accompanying drawings, in which.

DETAILED DESCRIPTION OF EMBODIMENTS

The invention provides a non-binary successive approximation analogue to digital converter for converting using successive conversion steps, which is operable in first and second modes. The first and second modes have different noise properties and the converter is switched between the modes during the conversion process.

By "non-binary" is meant that the conversion process has a reduced-radix in each conversion cycle, which offers built in redundancy. This means the sum of the weights w is greater than the maximum amplitude signal that is to be converted, rather than equal to it as in the binary converter case. The range offered by the ADC is larger than the input signal maximum value.

Thus, a low noise level is achieved by operating the circuit in a way which allows signals to settle accurately—i.e. the electrical damping characteristics and timings are selected to enable accurate circuit operation, at the expense of increased time to perform the conversion steps.

As outlined above, there is thermal noise arising from the sampling operation of the Track and Hold (T/H) unit and noise added during the conversion process by the DAC, preamplifier and the comparator.

The sampling noise from the T/H unit is added during sampling at the beginning of the conversion and stays constant during the conversion process. Therefore it is treated by the successive approximation algorithm in the same fashion as the input signal.

The noise during the SAR loop operation (i.e. noise added by the elements in the feedback loop, namely the preamplifier, comparator and DAC) is superimposed to the approximation error Vsmpd–$V_{DAC}$ at each conversion step and can affect the decision of the comparator. This loop noise Vnloop will affect the comparator decision when this difference $V_{smpd}$–$V_{DAC}$ is comparable with its input-referred RMS value (VnloopRMS) whose expression is:

$$V_{nloopRMS} = \frac{1}{G}\sqrt{\gamma\frac{2KT}{C_{loop}}} \quad (1)$$

where Cloop is the total capacitance at the input of the comparator and G is the voltage gain of the preamplifier. The parameter γ (>1) is an additional factor that takes into account of the noise coming from the DAC and the specific circuit topology (e.g. number of stages) of the preamplifier.

Figure 4:
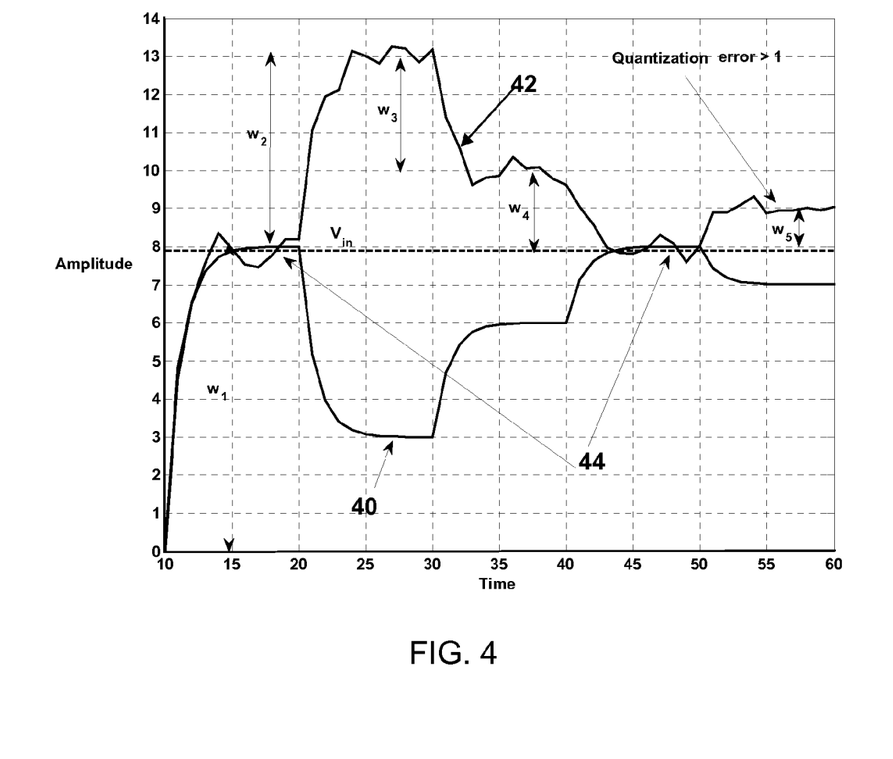
FIG. 4 shows the normal operation of the converter of FIG. 1 operating as a non-binary converter, and how a multiple comparison errors cannot be compensated.

An example of the impact of SAR loop noise on the non-binary SAR converter operation is depicted in FIG. 4.

Plot 40 shows the conversion process without loop noise and plot 42 shows the case with comparison errors 44 arising from loop noise. When the difference $V_{smpd}$–$V_{DAC}$ is small (step 2 and 5) the loop noise affects the comparator decision. The first comparison error at step 2 (associated with weight w2) is compensated because it is within the corresponding overrange o2 while the second error at step 5 (associated with weight w5) is not compensated.

Thus, in this example loop noise affects the comparator decision at the 2nd and the 5th step resulting in an error in the final approximated value. As numerical example from an actual 10 bit SAR design, a preamplifier gain G equal to 10 is assumed, a γ factor equal to 6 and 4 fF as Cloop capacitance. With these numbers the loop noise limits the converter SNR to approximately 56 dB from the theoretical maximum of 61.7 dB.

The noise problem is exacerbated when SAR ADCs are used in a time-Interleaved ADC architecture. In this architecture many unit SAR ADCs are interleaved in time to achieve high sampling rates. For example, 64 unit SAR ADCs can be interleaved to achieve 2.6 GS/s operation.

Achieving high sampling rate, large input signal bandwidth and low noise in the interleaved T/H front-end of such an ADC becomes extremely difficult. As a consequence it is crucial to minimize the impact of the noise coming from the SAR unit converters such that they do not degrade the total noise budget.

The most straightforward way of dealing with loop noise is to increase the preamplifier gain G (and its power consumption) but in scaled CMOS technologies it is difficult to achieve very high gains without using several amplification stages. As a result of that, a larger number of devices will contribute to the noise thus increasing the γ factor. Increasing Cloop is another way of reducing the loop noise but this has a direct impact on the maximum converter speed because it increases the settling time of the preamplifier.

The invention is based on the observation that the redundancy of the non-binary SAR algorithm can compensate for every comparison error (including noise) whose magnitude is smaller than the overrange at the corresponding conversion step. In fact, during the steps in which the overrange is larger than the loop noise the comparison errors can in principle be compensated during the following conversion cycles. This condition applies for most steps in practice making them potentially resilient to loop noise errors. Only during the last few conversion cycles when the overrange is very small does loop noise generate errors that cannot be compensated.

This behavior is shown in the example of FIG. 4 in which the comparison error at step 2 is compensated by the following 2 steps. After that point however there is no more overrange available and the comparison error at step 5 results immediately in an error of the final approximated value.

The invention reduces the impact of loop noise on the converter performance by changing dynamically, during the conversion process, the integrated noise in each conversion step, e.g. by modifying the bandwidth over which noise is integrated. For example, the bandwidth of the SAR loop is reduced, and thus the total integrated loop noise, during the cycles where overrange is small, but a high bandwidth is allowed during the cycles where overrange is large.

Figure 5:
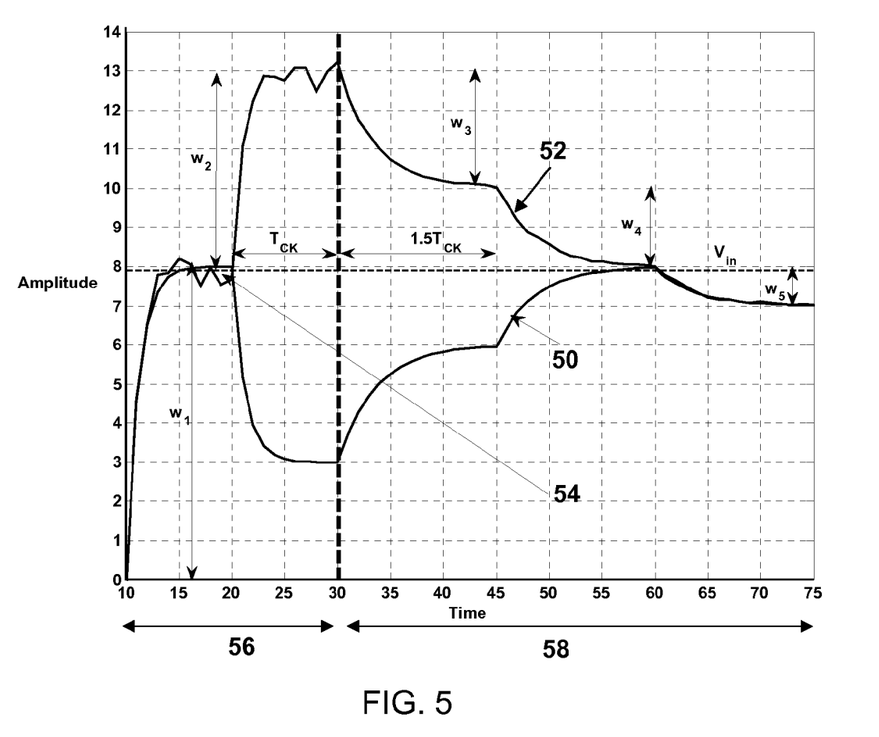
FIG. 5 shows how a converter can be operated in accordance with the invention.

An example of operation of the invention is depicted in FIG. 5.

Plot 50 shows the correct cycle with no errors and plot 52 shows the plot where a comparison error 54 is made due to loop noise.

The invention provides different modes of operation during the conversion process. A faster conversion mode 56 is prone to increased loop noise, whereas a slower conversion mode 58 can reduce this noise. Thus, a fast conversion mode can be enabled when any errors resulting from the increased noise will later be compensated, whereas when such errors cannot be compensated, a slower mode can be enabled during which the probability of loop noise errors is reduced.

In this case the preamplifier and DAC run in high speed "large bandwidth" mode 56 (thus, more noise) during the first 3 comparison cycles. In these steps the settling of the difference $V_{smpd}-V_{DAC}$ is relatively fast and these cycles are executed at the nominal rate 1/TCK (equal to the main ADC clock).

After the 3rd comparison, the lower speed "small bandwidth" mode 58 (thus, less noise) of the loop is activated. This reduces the loop noise power integrated in each cycle In order to compensate for the increased settling time (more time is needed now for correct settling) the remaining cycles are executed at a reduced rate e.g. 1/(1.5TCK). Thus, in one example the conversion rate is reduced by 50%. A different value may be chosen, for example the conversion rate may by reduced by 10% to 80%, and more preferably 20% to 75%.

Thanks to the redundancy of the non-binary SAR algorithm, the effective loop noise level of the converter will become equal to its value during the last few conversion steps therefore compensating completely all the errors made during the earlier comparisons. Moreover, since low loop noise levels and reduced clock rates are required only during the last few conversion cycles, the additional conversion time compared to the traditional approach is minimized. In the example of FIG. 5 the total conversion time has increased by 25% compared to the conventional case of FIG. 4 but the errors generated during the "large bandwidth" mode are completely suppressed.

As a result of that, noise in the critical conversion steps of the SAR operation is reduced significantly while the initial error introduced in step 2 is properly compensated.

The invention can be applied to any non-binary SAR architecture in which it is possible to tune the noise of the blocks of the loop.

Figure 6:
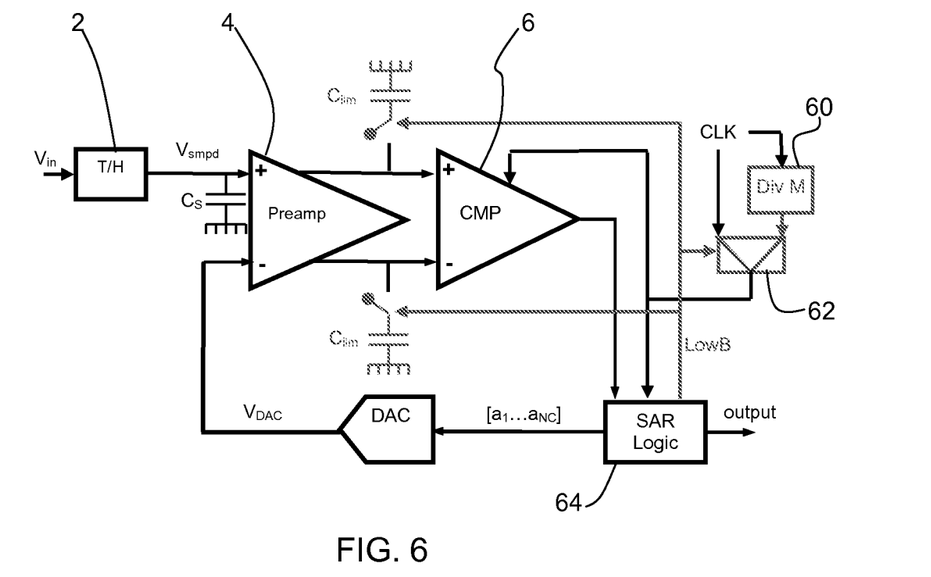
FIG. 6 shows an example of SAR analogue to digital converter of the invention.

A possible implementation of the invention is depicted in FIG. 6.

The track and hold unit 2, preamplifier 4 and comparator 6 are as in FIG. 1, although by way of example the preamplifier and comparator are shown with differential signals.

In this example, the loop noise is reduced during the last conversion cycles by connecting a limiting capacitor Clim at the output terminals of the preamplifier 4. When Clim is connected, the settling time of the preamplifier is increased and it is therefore necessary to increase the duration of the conversion cycle.

This can be done by reducing the clock frequency with a divider 60. A multiplexer 62 controls which clock signal is supplied to the SAR logic element 64. The SAR logic 64 controls the switching into circuit of the capacitors Clim with the low bandwidth control signal "LowB". The converter operations are summarized below.

During the first clock cycle the input signal is sampled on the capacitor $C_S$ by the track and hold unit 2.

During the first N1 clock cycles the signal lowB is low therefore the capacitors Clim are disconnected and the input clock CLK is sent directly to the controller and the comparator. As a result, the converter performs the first N1 cycles at the same rate of the input clock CLK and the loop blocks run in "large bandwidth" (high noise) mode.

At the beginning of the (N1+1)th conversion cycle, the SAR controller connects the capacitors Clim hence reducing the bandwidth of the preamplifier and the power of the loop noise. At the same time the divided clock is selected by the multiplexer, hence decreasing the converter clock frequency by a factor M.

The remaining N2 conversion cycles are then performed in "low bandwidth" (low noise) mode and the need for additional settling time (due to less bandwidth) is satisfied by the lower clock rate.

Only the power of loop noise during the final N2 steps will affect the converter performance. Its value depends on the value of Clim and it is equal to:

$$V_{nloopLow}^2 = \frac{1}{G^2}\gamma\frac{2KT}{C_{loop}+C_{lim}}$$

The improvement of the loop noise performance can be significant even for relatively small values of capacitor Clim because in practical designs the value of the capacitance Cloop is small.

From the previous numerical example, adding a Clim capacitance of 6fF with a Cloop equal to 4 fF automatically reduces the power of the loop noise by 4 dB. This translates into an improvement in SNR of 2.6 dB (58.6 dB) compared to the previous case (56 dB).

The amount of capacitance Clim that can be added is limited by the maximum increase in the settling time that can be tolerated while running the converter at the reduced clock rate. Assuming a fixed clock frequency division M, the additional settling time available is roughly equal to TCK(1/M-1).

Another key parameter is the number of slow rate steps N2 that determines the additional conversion time compared to the conventional approach. N2 depends mainly on the ratio between the loop noise amplitude Vnloophigh in "large bandwidth" mode and overrange available at every step.

As the conversion proceeds, the overrange of becomes comparable to Vnloophigh and it is therefore needed to switch to the "low bandwidth" mode. If too many conversion cycles are executed in the "large bandwidth" mode, the ADC noise performance will be degraded.

As an example, a non-binary ADC is considered that requires 11 comparison cycles to achieve a resolution of 10 bits.

Figure 7:
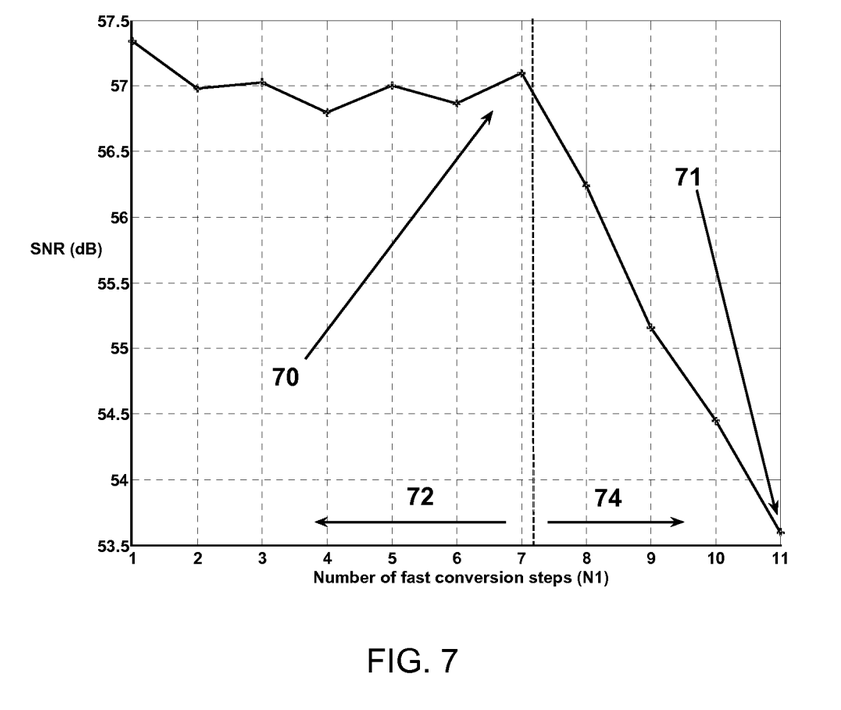
FIG. 7 is used to explain how the point where the conversion mode changes affects the signal to noise ratio.

FIG. 7 shows the simulation of the SNR of the ADC as a function of the number of fast (large bandwidth) conversion steps N1.

The plot shows that increasing from N1 equal to 8 the ADC SNR performance degrades because the available overrange of steps 8 to 11 is not enough to compensate for the loop noise errors. In this example, if N1 is set to 7 (point 70) the proposed invention gives an improvement in SNR of 3.5 dB at the expense of increasing the conversion time by only 18%. The SNR is 57 dB at point 70 compared to 53.6 dB at point 71 for a conventional approach with all conversion steps the same. In region 72, the overrange is larger than the loop noise, and in region 74, the overrange is smaller than the loop noise.

The invention is of interest for any non-binary SAR converter, regardless of the specific architecture. The proposed invention allows the loop noise to be reduced to a level that it does not have any impact on the converter performance without increasing the power consumption.

As shown, in practical examples, SNR improvements in the order of several dB (e.g. 3.5 dB) can be achieved while increasing the conversion time by only 20%. When employed in Time Interleaved SAR ADC, the invention allows major improvements in the converter SNR (signal to noise ratio) at the price of a slight increase in the number of interleaved SAR ADC units (needed to cope for the increase in conversion time). This increased SNR translates into an increase the receiver sensitivity when forming part of a receiver circuit.

The invention can be easily applied to existing designs since it requires only minor modifications to the existing analog hardware (only 2 capacitors and a clock divider). This property makes the proposed invention very appealing when targeting significant SNR improvements without redesigning the converter circuitry.

The invention enables suppression of the loop noise and potential SNR improvements of several dB without increasing the power consumption of non-binary SAR ADC.

In the example above, the noise level is tuned using capacitors which are switched into circuit to restrict the bandwidth. However, the performance of the conversion loop can b tuned in different ways, such as:

the noise level and/or loop bandwidth can be tuned by changing the bias current of one or more blocks of the loop.

the noise level can be tuned by changing the value of another electrical component (e.g. resistor/capacitor/transistor) of one or more blocks of the loop.

the noise level can be tuned by changing the supply level of one or more blocks of the loop.

The SAR ADC can be implemented in various different circuit topologies based on resistors, capacitors or current DACs, whereas the preamplifier can be based on single or multiple stages, or alternatively in other implementations it can be omitted as well. In another SAR ADC implementation related to this invention and particularly suited for time interleaving, the SAR ADC is based on a feedforward/feedback architecture as shown in WO2010/044000.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A non-binary successive approximation analogue to digital converter for converting using successive conversion steps, the converter comprising
    a sample and hold unit, a comparator, a logic unit, a digital to analogue converter, a preamplifier between the sample and hold unit and the comparator, and one or more capacitors which are switchable in or out of circuit at an output of the preamplifier for changing noise properties, wherein
    the logic unit and the digital to analogue converter are in a feedback path around the comparator, and
    the converter is operable in first and second modes, the first and second modes having different noise properties and the converter is operable to switch between the first and second modes during the conversion process.

2. A converter as claimed in claim 1, further comprising an element for adjusting a duration of the conversion steps such that different durations are used in the first and second modes.

3. A converter as claimed in claim 2, further comprising a clock circuit having an output, wherein the device for adjusting comprises a clock divider for reducing a frequency of the clock circuit output, and a multiplexer is provided for selecting the clock circuit output or the frequency-reduced clock.

4. A converter as claimed in claim 1, further comprising an element for changing a bias current for changing the noise properties.

5. A converter as claimed in claim 1, further comprising a tunable electrical supply voltage for changing the noise properties.

6. A converter as claimed in claim 1, wherein the noise property comprises a total noise power integrated across an operation bandwidth.

7. A time-interleaved analog to digital converter comprising a plurality of successive approximation analog to digital converters according to claim 1.

8. The time-interleaved analog to digital converter of claim 7, further comprising 64 successive approximation analog to digital converters, wherein the time-interleaved analog to digital converter is operable at 2.6 Gigasamples per second.

9. A telecommunication receiver comprising a time-interleaved analog to digital converter, according to claim 7.

10. A method of controlling a non-binary successive approximation analog to digital converter, the converter comprising a sample and hold unit, a comparator, a logic unit, a digital to analogue converter, a preamplifier between the sample and hold unit and the comparator, and one or more capacitors which are switchable in or out of circuit at an output of the preamplifier for changing noise properties, the method comprising:

operating the converter in first and second modes during a conversion process using successive conversion steps by switching the one or more capacitors in or out of circuit, the modes having different noise properties.

11. A method as claimed in claim 10, wherein a first batch of conversion steps are performed with the first mode of operation, with a first noise level, and a second later batch of conversion steps are performed with the second mode of operation, with a smaller, second noise level.

12. A method as claimed in claim 10, further comprising adjusting durations of the conversion steps such that different durations are used in the first and second modes.

13. A method as claimed in claim 10, further comprising reducing a frequency of a clock signal, and selecting the clock signal or the frequency-reduced clock signal for the conversion process, depending on the mode.

* * * * *